(12) United States Patent
Venugopal et al.

(10) Patent No.: US 7,407,850 B2
(45) Date of Patent: Aug. 5, 2008

(54) N+ POLY ON HIGH-K DIELECTRIC FOR SEMICONDUCTOR DEVICES

(75) Inventors: Ramesh Venugopal, Richardson, TX (US); Christoph Wasshuber, Parker, TX (US); David Barry Scott, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 353 days.

(21) Appl. No.: 11/091,989

(22) Filed: Mar. 29, 2005

(65) Prior Publication Data

US 2006/0223248 A1    Oct. 5, 2006

(51) Int. Cl.
*H01L 21/8238* (2006.01)

(52) U.S. Cl. .................. 438/216; 438/217; 438/532; 257/E21.639

(58) Field of Classification Search .............. 438/216, 438/217, 290, 291, 532; 257/E21.639
See application file for complete search history.

(56) References Cited

U.S. PATENT DOCUMENTS

| | | | |
|---|---|---|---|
| 4,845,047 A | 7/1989 | Holloway et al. | |
| 6,358,805 B2 | 3/2002 | Son et al. | |
| 6,544,906 B2 | 4/2003 | Rotondaro et al. | |
| 6,566,184 B1 | 5/2003 | Wei et al. | |
| 6,656,852 B2 | 12/2003 | Rotondaro et al. | |
| 2002/0033511 A1* | 3/2002 | Babcock et al. | 257/408 |
| 2003/0129817 A1 | 7/2003 | Visokay et al. | |
| 2004/0185629 A1 | 9/2004 | Mansoori et al. | |
| 2005/0064716 A1 | 3/2005 | Lin et al. | |

* cited by examiner

*Primary Examiner*—Chandra Chaudhari
(74) *Attorney, Agent, or Firm*—Wade J. Brady, III; Frederick J. Telecky, Jr.

(57) ABSTRACT

The present invention facilitates semiconductor fabrication by providing methods of fabrication that employ high-k dielectric layers. An n-type well region (304) is formed within a semiconductor body (302). A threshold voltage adjustment implant is performed by implanting a p-type dopant into the n-type well region to form a counter doped region (307). A high-k dielectric layer (308) is formed over the device (300). A polysilicon layer (310) is formed on the high-k dielectric layer and doped n-type. The high-k dielectric layer (308) and the polysilicon layer (310) are patterned to form polysilicon gate structures. P-type source/drain regions (306) are formed within the n-type well region (304).

16 Claims, 8 Drawing Sheets

N+ POLY ON HIGH-K DIELECTRIC FOR SEMICONDUCTOR DEVICES

FIELD OF INVENTION

The present invention relates generally to semiconductor devices and more particularly to transistor devices having high-k dielectric layers and polysilicon gate layers and associated methods of manufacture.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or growing silicon dioxide ($SiO_2$) over a silicon wafer surface, with doped polysilicon formed over the $SiO_2$ to act as the gate electrode.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface. However, there are electrical and physical limitations on the extent to which the thickness of $SiO_2$ gate dielectrics can be reduced. For example, very thin $SiO_2$ gate dielectrics are prone to gate tunneling leakage currents resulting from direct tunneling through the thin gate oxide. In addition, there are conventional limitations on the ability to form such thin oxide films with uniform thickness. Furthermore, thin $SiO_2$ gate dielectric layers provide a poor diffusion barrier to dopants, for example, and may allow high boron dopant penetration from the underlying channel region of the silicon during fabrication of the source/drain regions.

Recent MOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

The performance of the resulting MOS transistors is dependent upon the high-k gate dielectric material, including the bulk high-k material and on a thickness or equivalent oxide thickness of deposited material. Unlike $SiO_2$, which may be formed by thermal oxidation (growth process), high-k dielectrics are typically deposited over the semiconductor substrate, using chemical vapor deposition (CVD), physical vapor deposition (PVD), atomic layer deposition (ALD), molecular beam epitaxy (MBE), or other deposition processes. While the macroscopic composition (e.g., stoichiometry) of these materials may be controlled to a certain extent during such deposition processes, stoichiometric composition variations within the film may degrade device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention provides systems and methods that facilitate semiconductor fabrication by integrating high-k dielectric layers and polysilicon gate layers into the process flow. Use of polysilicon gates and high-k dielectric layers can permit decreased device size and -improved device performance, but do present some problems such as threshold voltage shift. Undesirable effects resulting from the inclusion of the high-k dielectric layers with the polysilicon gate layers, particularly with respect to PMOS devices, are mitigated by the present invention. An n-type doped polysilicon gate layer and a counter doping, threshold voltage implant are employed in order to mitigate the undesirable affects. The n-type doped polysilicon gate layer mitigates or eliminates poly depletion, which otherwise degrades performance of a PMOS device. The n-type doped polysilicon gate layer and the high-k dielectric layer result in a known threshold voltage shift, instead of a variable, uncontrolled shift. The counter doping, because the shift is known and predictable, can be employed to account for that shift.

In accordance with an aspect of the present invention, an n-type well region is formed within a semiconductor body. A threshold voltage adjustment implant is performed by implanting a p-type dopant into the n-type well region to form a counter doped region. A high-k dielectric layer is formed over the device. A polysilicon layer is formed on the high-k dielectric layer and doped with an n-type dopant. The high-k dielectric layer and the polysilicon layer are patterned to form polysilicon gate structures. P-type source/drain regions are formed within the n-type well region.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
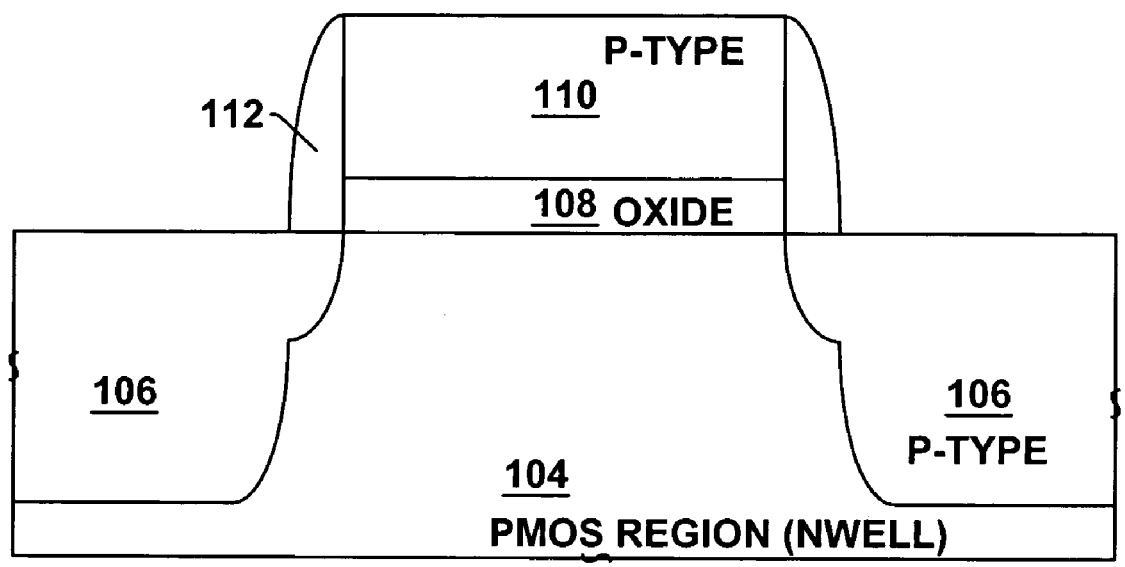
FIG. 1 is a cross sectional view of a conventional PMOS transistor device formed with oxide as a dielectric layer and a p-type doped polysilicon gate.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while reducing masks employed in fabrication thereof.

The present invention facilitates semiconductor fabrication by providing methods of fabrication that integrate high-k dielectric layers and polysilicon gate layers into the process flow. Use of polysilicon gates and high-k dielectric layers can permit decreased device size and improved device performance, but do present some problems such as threshold voltage shift. Undesirable effects resulting from the inclusion of the high-k dielectric layers with the polysilicon gate layers, particularly with respect to PMOS devices, are mitigated by the present invention. An n-type doped polysilicon gate layer and a counter doping, such as a threshold voltage implant are employed in order to mitigate the undesirable effects. The n-type doped polysilicon gate layer mitigates or eliminates poly depletion, which otherwise degrades performance of a device. The n-type doped polysilicon gate layer and the, high-k dielectric layer result in a known threshold voltage controlled shift, instead of a variable shift. The counter doping, because the shift is known and predictable, can be employed to account for that shift.

FIG. 1 is a cross sectional view of a conventional PMOS transistor device 100 formed with oxide ($SiO_2$) as a dielectric layer and a p-type doped polysilicon gate. This device 100 described is exemplary in nature and is provided to facilitate understanding of the present invention.

The device 100 comprises an n-type well region 104 formed within a p-type semiconductor substrate or body. Implanting an n-type dopant, such as phosphorous, into the semiconductor body with a relatively low dose and high energy, forms the well region 104. P-type source/drain regions 106 are formed within the well region 104. Implanting a p-type dopant, such as boron, into the well region 104 with a relatively high dose and lower energy forms the source/drain regions 106. The p-type source/drain regions can also have an extension portion or lightly doped region (LDD) between the source/drain regions and the channel.

A gate structure or stack overlies the channel and includes an oxide layer 108 and a p-type polysilicon layer 110 formed on the oxide layer 108. The oxide layer 108 (not drawn to scale) operates as a dielectric layer for the gate structure and is typically formed by a thermal growth process. The polysilicon layer 110 is formed on the oxide layer 108, after which a patterning operation is performed to form the gate structure. The polysilicon layer 110 is doped with a p-type dopant, such as boron, typically during formation of the source/drain regions 106. Sidewalls 112 are formed on lateral edges of the gate structure in order to protect the gate structure and facilitate formation of the source/drain regions 106. The sidewalls 112 can be formed by depositing an insulative material, such as nitride, oxide, or both, over the device conformally and then anisotripically etching the layer.

The device 100 operates when a sufficient voltage, referred to as a threshold voltage or greater (in magnitude), is applied to the polysilicon layer 110 of the gate structure. The threshold voltage generates a sufficient electric field across a channel region below the gate structure. When this happens, a conductive path is formed below the gate structure between the source/drain regions 106 allowing current to flow there between. A parameter that determines the threshold voltage is the work function the polysilicon layer 110 and the doping level in the channel region. Generally, for PMOS devices, the higher the work function, the lower (less negative) the threshold voltage.

A thickness of the oxide layer 108 also affects operation of the device 100. Generally, the speed and other functional characteristics are determined by capacitance for the device 100, which is, in turn, a function of the thickness of the oxide layer 108. Generally, the thinner the oxide layer 108, the higher the drive current of the transistor device 100, the higher the capacitance, and the smaller the threshold voltage (in magnitude) for the transistor device 100. As an example, a circuit employing the transistor device 100 with a thinner oxide layer operates relatively faster because of higher drive current. As stated above, the capacitance resulting from the thinner oxide layer increases, but other capacitances within the circuit, also driven by the drive current, are not increased by the thinner oxide. Hence, using a thinner oxide layer results in a faster circuit. However, there are electrical and physical limitations on the extent to which thicknesses of the oxide layer 108 can be reduced. For example, very thin oxide dielectrics are prone to large gate tunneling leakage currents resulting from direct tunneling through the thin gate oxide. In addition, there are conventional limitations on the ability to form such thin oxide films with uniform thickness. Furthermore, thin oxide layers provide a poor diffusion barrier to dopants.

Figure 2:
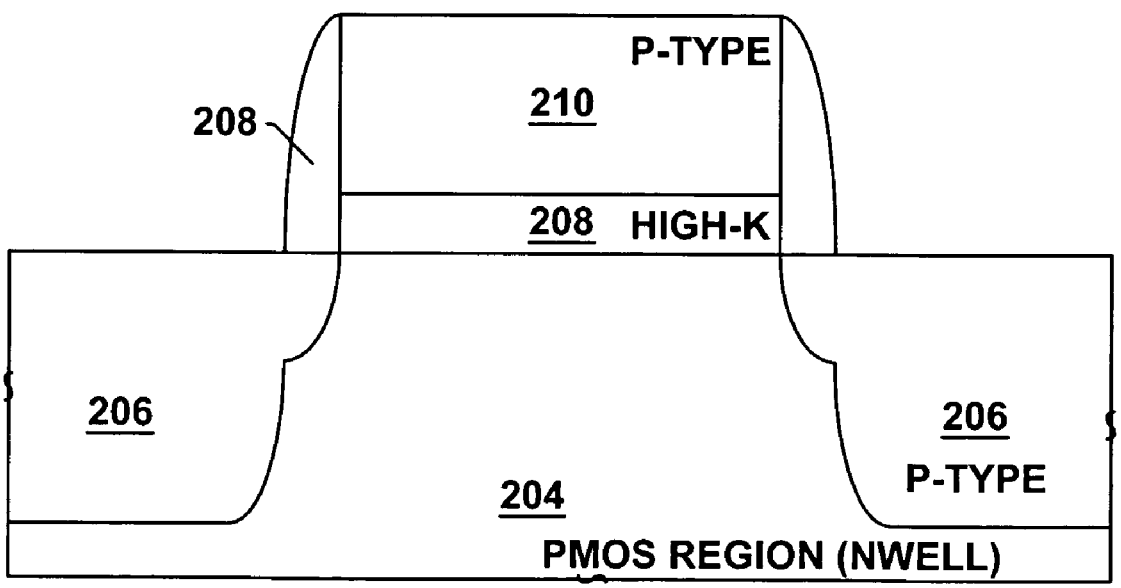
FIG. 2 is a cross sectional view of another conventional PMOS transistor device formed with a high-k dielectric layer and a p-type doped polysilicon gate.

FIG. 2 is a cross sectional view of another conventional PMOS transistor device 200 formed with a high-k dielectric layer and a p-type doped polysilicon gate. The high-k dielectric layer permits a thicker dielectric layer to be employed with the device and yet have similar electrical properties to the thinner oxide layer of the prior art FIG. 1. This device 200 described below is exemplary in nature and is provided to facilitate understanding of the present invention.

The device 200 comprises an n-type well region 204 formed within a semiconductor substrate or body. Implanting an n-type dopant, such as phosphorous, into the semiconductor body with a relatively low dose and high energy, forms the well region 204. P-type source/drain regions 206 are formed within the well region 204. Implanting a p-type dopant, such as boron, into the well region 204 with a relatively high dose and lower energy forms the source/drain regions 206. The p-type source/drain regions can also have an extension portion or lightly doped region (LDD).

A gate structure or stack comprises a high-k dielectric layer 208 and a p-type polysilicon layer 210 formed on the high-k dielectric layer 208. The high-k dielectric layer 208 is formed over the device using a deposition process, such as a chemical vapor deposition process (CVD) and operates as a dielectric layer for the gate structure. The layer 208 is comprised of high-k dielectric materials that have dielectric constants greater than that of $SiO_2$ (e.g., greater than about 3.9), which can be formed in a thicker layer than scaled $SiO_2$, and yet which produce equivalent field effect performance. The polysilicon layer 210 is formed on the high-k dielectric layer 208, after which a patterning operation is performed to form the gate structure. The polysilicon layer 210 is doped with a p-type dopant, such as boron, typically during formation of the source/drain regions 206. Sidewalls 212 are formed on lateral edges of the gate structure in order to protect the gate structure and facilitate formation of the source/drain regions 206. The sidewalls 212 can be formed by depositing an insulative material, such as oxide, over the device conformally and then anisotripically etching the device.

The device 200, again, operates when a sufficient voltage, referred to as a threshold voltage, is applied to the polysilicon layer 210 of the gate structure. The threshold voltage generates a sufficient electric field across a channel region below the gate structure. When this happens, a conductive path is formed below the gate structure between the source/drain regions 206 allowing current to flow there between. Parameters that determines the threshold voltage are the work function the polysilicon layer 210, which has a concentration of p-type dopants, and the doping level in the channel region, which has a concentration of n-type dopants. Generally, the lower the work function, the lower the threshold voltage.

A thickness or equivalent oxide thickness of the high-k dielectric layer 208 also affects operation of the device 200. As stated above, the speed and other functional characteristics are determined by capacitance for the device 200, which is, in turn, a function of the thickness or equivalent oxide thickness of the high-k dielectric layer 208. Generally, the thinner the high-k dielectric layer 208, the higher the drive current and the smaller the magnitude of the threshold voltage required.

The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Use of high-k dielectric materials with polysilicon gate layers can have adverse effects on devices employed therein. As a result, device performance can be degraded, particularly for PMOS devices such as the device 200. Generally, the use of high-k dielectric materials or layers for conventional PMOS devices results in variable, non-predictable reductions in threshold voltage and degraded capacitance.

The threshold voltages are reduced or shifted in varying uncontrolled amounts in PMOS devices. One cause of this shift may be due to dopants present in high-k dielectric layers that result in high fixed charge density. This leads to unpredictable shifts or increases in threshold voltages that can be difficult to account for by counter doping the channel region, typically performed prior to gate formation in MOS devices.

Capacitance degradation occurs as a result of poly depletion by the high-k layer. A p-doped polysilicon gate layer experiences a depletion of positive charges near an interface with the high-k dielectric layer. As a result, the electric field present in the channel region is reduced. The poly depletion effect causes the high-k dielectric layer to electrically function as if it were thicker than it actually is. A contributing factor to the poly depletion is that dopant concentration for p-type polysilicon gate layers is limited because p-type dopants, such as boron, tend to diffuse out of p-type doped gate structures and thus resist higher dopant levels.

Figure 3:
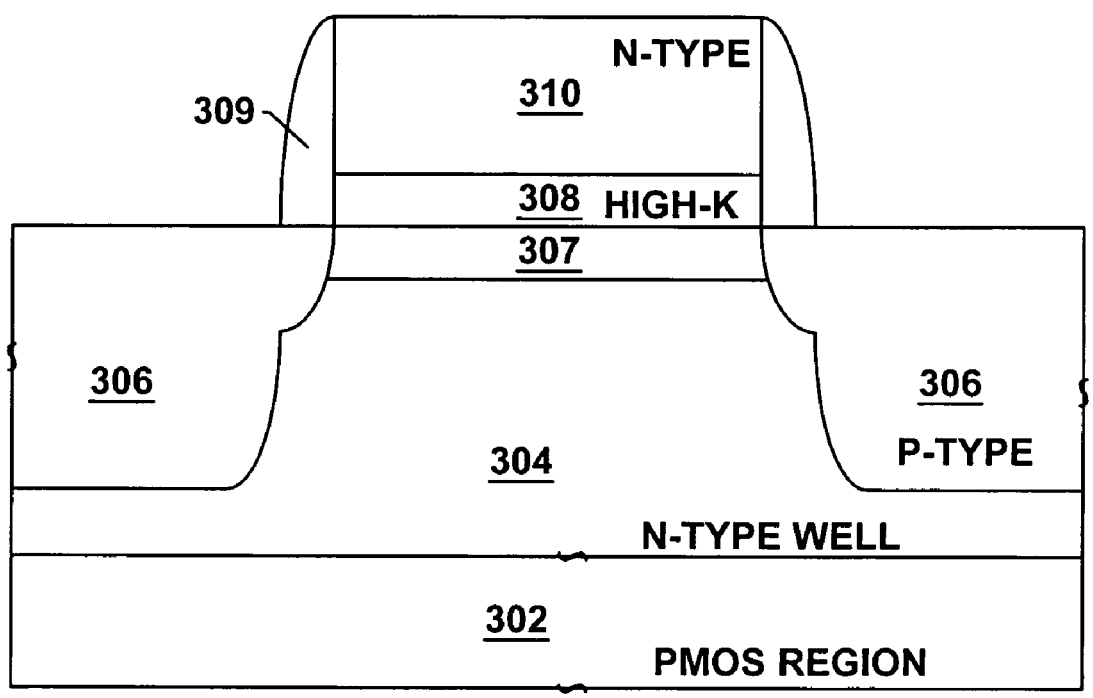
FIG. 3 is a cross sectional view of a PMOS transistor device formed with a high-k dielectric layer and an n-type doped polysilicon gate in accordance with an aspect of the present invention.

FIG. 3 is a cross sectional view of a PMOS transistor device 300 formed with a high-k dielectric layer and an n-type doped polysilicon gate in accordance with an aspect of the present invention. The n-type doped polysilicon gate, in conjunction with the high-k dielectric layer, results in a predictable shift in threshold voltage and also results in mitigated capacitance degradation. The predictable shift in threshold voltage can be compensated by over doping or counter doping because the adjustment is known even before gate structure formation. Additionally, the capacitor degradation is mitigated by eliminating the poly depletion in the polysilicon gate because of the n-type poly doping instead of the conventional p-type poly doping.

The exemplary device 300 comprises an n-type well region 304 formed within a semiconductor substrate or body. Implanting an n-type dopant, such as phosphorous, into the semiconductor body with a relatively low dose and high energy, forms the well region 304. P-type source/drain regions 306 are formed within the well region 304 by implanting a p-type dopant, such as boron, into the well region 304 with a relatively high dose and lower energy. The p-type source/drain regions can also have an extension portion or lightly doped region (LDD) formed by a shallow, low energy implant of a p-type dopant prior to formation of sidewall spacers 309.

A threshold voltage adjustment implant forms a shallow counter doped region 307, that is formed by one or more shallow p-type implants (e.g., boron) with relatively low energy. In one example of the invention, a diffusion inhibiting material, such as carbon, is implanted with the p-type dopant to mitigate diffusion thereof.

A gate structure or stack comprises a high-k dielectric layer 308 and an n-type doped polysilicon layer 310 formed on the high-k dielectric layer 308. The high-k dielectric layer 308 is formed over the device using a deposition process. Unlike $SiO_2$, which may be formed by thermal oxidation (growth process), the high-k dielectric layer 308 is formed by depositing a high-k dielectric material over the device, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT) for the dielectric layer in the core region.

The layer 308 is comprised of high-k dielectric materials that have dielectric constants greater than that of $SiO_2$ (e.g., greater than about 3.9), which can be formed in a thicker layer than scaled $SiO_2$, and yet which produce equivalent field effect performance. The polysilicon layer 310 is then formed on the high-k dielectric layer 308, after which a patterning operation is performed to form the gate structure. The polysilicon layer 310 is doped with an n-type dopant, such as phosphorous separately than formation of the p-type source/drain regions 306. Sidewalls 312 are formed on lateral edges of the gate structure in order to protect the gate structure and facilitate formation of the source/drain regions 306. The sidewalls 312 can be formed by depositing an insulative material, such as oxide, over the device conformally and then anisotripically etching the device.

The device 300 operates when a threshold voltage or greater (in magnitude) is applied to the polysilicon layer 310 of the gate structure. The threshold voltage generates a sufficient electric field across a channel region below the gate structure. When this happens, a conductive path is formed below the gate structure between the source/drain regions 306 allowing current to flow there between. A parameter that determines the threshold voltage is the work function the polysilicon layer 310, which has a concentration of n-type dopants, and the doping level in the channel region, which has a concentration of p-type dopants, because of counter doping. Generally, the higher the work function, the lower the threshold voltage.

A thickness or equivalent oxide thickness of the high-k dielectric layer 308 also impacts operation of the device 300. As stated above, the speed and other functional characteristics are determined by capacitance for the device 300, which is, in turn, a function of the thickness or equivalent oxide thickness of the high-k dielectric layer 308. Generally, the thinner the high-k dielectric layer 308, the faster a circuit or device employing the transistor device 300 can operate and the lower the threshold voltage that can be tolerated.

As stated above, the relative electrical performance of such high-k dielectric materials can be expressed as equivalent oxide thickness (EOT), because the high-k material layer maybe thicker, while still providing the equivalent electrical effect of a much thinner layer of silicon dioxide. Since the dielectric constant "k" is higher than silicon dioxide (3.9), a thicker high-k dielectric layer can be employed to mitigate tunneling leakage currents, while still achieving the equivalent electrical performance of a thinner layer of thermally grown silicon dioxide.

The threshold voltage for the device 300 is reduced a known and/or predictable value. The shift is due to the use of the n-type doped polysilicon layer 310, which shifts the threshold voltage about 1.1 volts, without channel counter doping as compared to a similar device utilizing an oxide layer as a dielectric material. However, the counter doping present in the region 307 counteracts this known shift and obtains the desired threshold voltage for the device 300.

Additionally, poly depletion is avoided by using the n-doped polysilicon gate layer 310. The n-type dopants present/implanted within the polysilicon gate 310 mitigate positive charge from collecting at an interface between the polysilicon gate and the high-k dielectric layer 308. Even if positive charge does collect, the positive charge gets utilized by the n-doped polysilicon gate 310.

Referring to FIGS. 4 and 5A-5M, further aspects of the invention relate to methods of fabricating semiconductor devices, wherein FIG. 3 illustrates an exemplary method of fabrication in accordance with the invention, and FIGS. 5A-5M illustrate the exemplary transistor device at various stages of fabrication in accordance with the invention.

Figure 4:
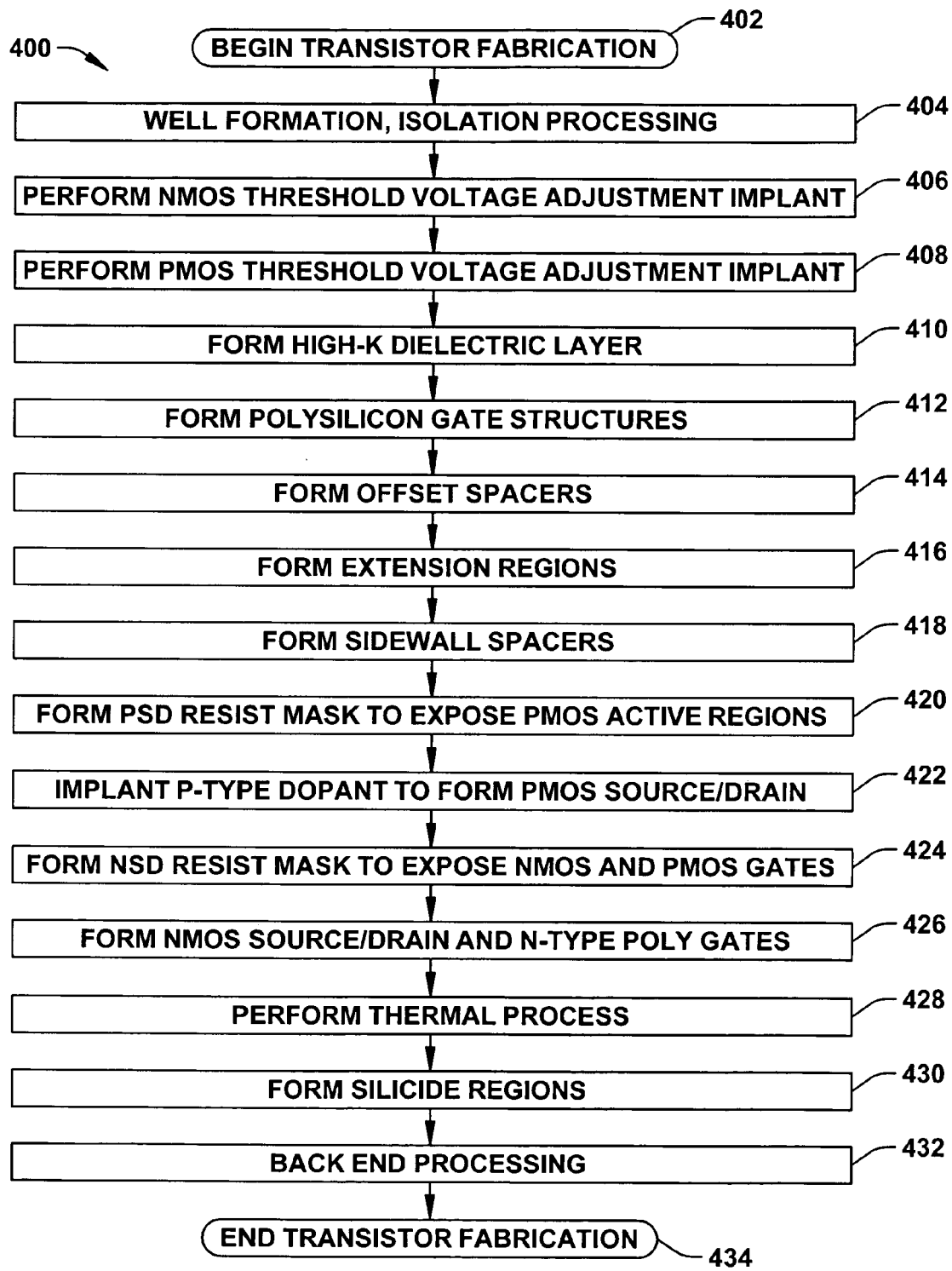
FIG. 4 is a flow diagram illustrating a method of fabricating a semiconductor device employing high-k dielectric layers and n-type doped polysilicon gates in accordance with an aspect of the present invention.

FIG. 4 is a flow diagram illustrating a method 400 of fabricating a semiconductor device employing high-k dielectric layers and n-type doped polysilicon gates in accordance with an aspect of the present invention. The method 400 utilizes the high-k dielectric layers, which improve performance and operation of the device as compared to other devices formed with oxide layers and utilizes the n-type doped polysilicon gates in both PMOS and NMOS regions to mitigate adverse impacts from using the high-k dielectric layers.

While the exemplary method 400 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 400 begins at 402, wherein transistor fabrication is initiated, and transistor well formation and isolation processing is performed at 404 thereby defining NMOS and PMOS regions, wherein NMOS regions comprise p-well regions in which n-type source/drain regions will later be formed, and PMOS regions comprise n-well regions in which p-type source/drain regions will later be formed, respectively. In addition, isolation regions may comprise shallow trench isolation (STI) or field oxide regions (LOCOS) that serve to define various active areas and electrically isolate various active areas laterally from one another.

An NMOS threshold voltage adjustment implant is performed within the NMOS region at block 406 by performing one or more successive implants of a p-type dopant. Later formed polysilicon gates are doped n-type, therefore implanting the p-type dopant increases and/or controls the threshold voltage, which is a sufficient voltage to induce conduction, also referred to as strong inversion. Threshold voltages that are too low can lead to leakage or currents being generated even when the transistor device is off.

The implant(s) of the p-type dopant are performed with a relatively low energy so as to implant the dopant relatively shallow. As a result, the threshold voltage can be increased without degrading conduction within later formed channel regions.

A PMOS threshold voltage adjustment implant is performed within the PMOS region at block 408 by also performing one or-more successive implants of a p-type dopant, which differs from conventional PMOS threshold voltage implants that typically only employ an n-type dopant. Later formed polysilicon gates within the PMOS region are n-type, therefore implanting the p-type dopant adjusts and/or controls the threshold voltage, which is a sufficient voltage to induce conduction, also referred to as strong inversion. It is noted that the dose employed for implanting the p-type dopant should be controlled to insure that the threshold voltage is not too low. Threshold voltages that are too low can lead to leakage or currents being generated even when the transistor device is off. It is noted that in one example the adjustment implant performed at block 408 can be performed at the same time as the adjustment implant performed at block 406, since both employ the same type of dopant. Alternatively, if the dopant necessary to properly tune the threshold voltage for the PMOS transistors needs to be significantly different than that employed for the NMOS transistors, a separate implant may be performed at block 408. It is noted that the threshold voltage implant at block 408 can also include implanting an n-type dopant, however the implanted p-type dopant still results in a shallow p-type region.

The one or more successive p-type implants counter dope a shallow portion of the n-well regions of the PMOS region. Additionally, this counter doping accounts for a known shift in threshold voltage (e.g., 1.1 Volts) due to the later use of high-k dielectric material and n-type doped polysilicon gates.

The threshold voltage shift for PMOS transistor devices within the PMOS region is a known and/or predictable value, as stated above. In one example, the shift is due to the use of the n-type doped polysilicon layer, which shifts the threshold voltage (e.g., about 1.1 volts). Without the counter doping at block 408, the threshold voltage would be increased as compared to a similar device utilizing an oxide layer as a dielectric material. However, the counter doping counteracts this known shift and obtains the desired threshold voltage for the PMOS devices. Furthermore, poly depletion is avoided by using n-type doped polysilicon gate layers, which are later formed. The n-type dopants present/implanted within the polysilicon gate prevent positive charge from collection on an interface between the polysilicon gate and the high-k dielectric layer.

Additionally, a diffusion inhibitor can also be implanted with the p-type dopant in conjunction with the implant performed at block 408. Generally, p-type dopants (e.g., boron) diffuse more rapidly than n-type dopants. The diffusion inhibitor mitigates diffusion of the implanted p-type dopants so as to maintain a desired concentration and depth of the counter doped region.

It is appreciated that alternate aspects of the invention contemplate methods wherein threshold voltage adjustment and/or counter doping are not performed. In such aspects, the shift in threshold voltage from using a high-k dielectric layer instead of an oxide layer is acceptable for device operation.

Other implants, such as n-type and p-type punch through implants, n-type and p-type channel stop implants, n-type and p-type pocket implants can also be performed. The punch through implants are for reducing transistor off current. The channel stop implants are for reducing isolation leakage. The pocket implants are for reducing threshold voltage roll-off.

The method 400 continues at 410, wherein a high-k dielectric layer is formed in active areas defined by the various formed isolation regions. The high-k dielectric layer is formed by depositing a suitable dielectric material over the device. Any suitable dielectric may be deposited at block 410 having a dielectric constant higher than that of $SiO_2$, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate -titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

Prior to deposition of the high-k dielectric material, a suitable surface preparation is typically performed. The surface preparation step might include the growth of an ultra-thin silicon dioxide layer with a thickness of one to six monolayers. Unlike $SiO_2$, which may be formed by thermal oxidation (growth process), the high-k dielectric layer is formed by depositing a high-k dielectric material over the semiconductor substrate, using chemical vapor deposition (CVD), physical vapor deposition (PVD), atomic layer deposition (ALD), molecular beam epitaxy (MBE), or other suitable deposition processes. The deposition process is performed so as to result in a thickness that results in a desired or selected equivalent oxide thickness (EOT) for the dielectric layer in the core region. High-k dielectric materials have dielectric constants that are greater than that of $SiO_2$ (e.g., greater than about 3.9). As a result, the high-k dielectric layer can be formed in a thicker layer than scaled $SiO_2$, and yet produce equivalent field effect performance. The relative electrical performance of such high-k dielectric materials is often expressed as EOT, because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Subsequently, a conductive polysilicon gate layer is then deposited over the gate dielectric layer at 412 and patterned to form polysilicon gate structures. For example, a polysilicon layer may be deposited via chemical vapor deposition (CVD) and patterned, along with the high-k dielectric layer, via etching to form polysilicon gate electrodes in both NMOS and PMOS regions.

An offset spacer is then formed on lateral-edges of the gate-structures at 414. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at 416 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 4, sidewall spacers are then formed on the gate structures at 418. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

A PSD resist mask is formed over the device at block 420 that exposes only active regions in the PMOS region. It is noted that the PSD resist mask (unlike conventional processes) does not expose the polysilicon gate structures within the PMOS region. Subsequently, p-type dopants (e.g., boron) are implanted into the exposed areas at block 422 and form source/drain regions within the PMOS region, but such p-type dopant does not get implanted into the PMOS polysilicon gates. The PSD resist mask is then removed.

Then, an NSD resist mask is formed over the device at block 424 that exposes the NMOS region and the polysilicon gate structures within the PMOS region. Conventional formation processes typically employ masks that only expose the NMOS region. Then, n-type dopants (e.g., phosphorous) are implanted into the exposed areas at block 426 and form n-type source/drain regions and n-type doped polysilicon gates within the NMOS region and form n-type doped polysilicon gates within the PMOS region. Subsequently, the NSD resist mask is removed.

It is appreciated that the present invention contemplates other mechanisms for obtaining n-type doped polysilicon gate structures within the PMOS region. For example, the polysilicon layer can be doped with n-type dopants during its formation. As another example, a separate mask could be employed to dope the polysilicon gate structures within the PMOS region, thereby allowing differing dopant concentrations for the NMOS and PMOS region.

A thermal process is subsequently performed at block 428 that activates the implanted regions and further forms the source/drain region in the PMOS and NMOS regions. The thermal process can comprise one or more anneal processes including, but not limited to spike anneals. Generally, thermal budgets are set for fabrication of semiconductor devices in order to prevent or mitigate damage from overexposure the thermal processes. A suitable, exemplary spike anneal is about 900 to about 1500 degrees Celsius for a relatively short duration (e.g., about 5 seconds or less). However, it is appreciated that other thermal processes can be employed.

The method 400 then concludes with silicide processing at 430, wherein a refractory metal material is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 432 to conclude the device formation at 434.

Figure 5A:
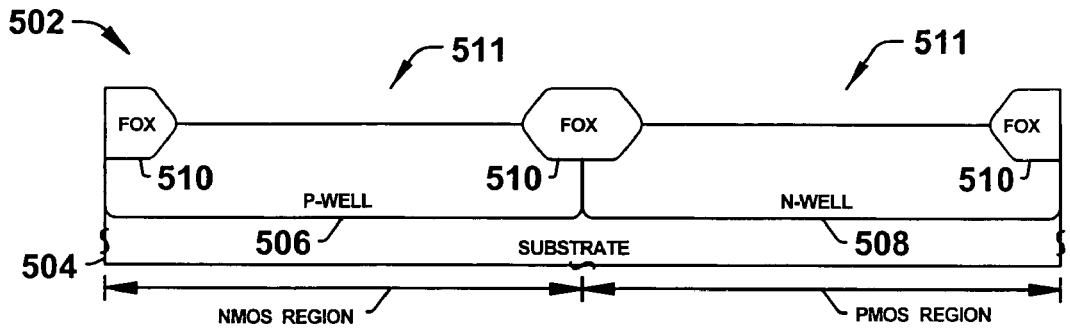
FIGS. 5A-5N are a plurality of fragmentary cross section diagrams illustrating a transistor device being formed in accordance with an aspect of the present invention.
Figure 5B:
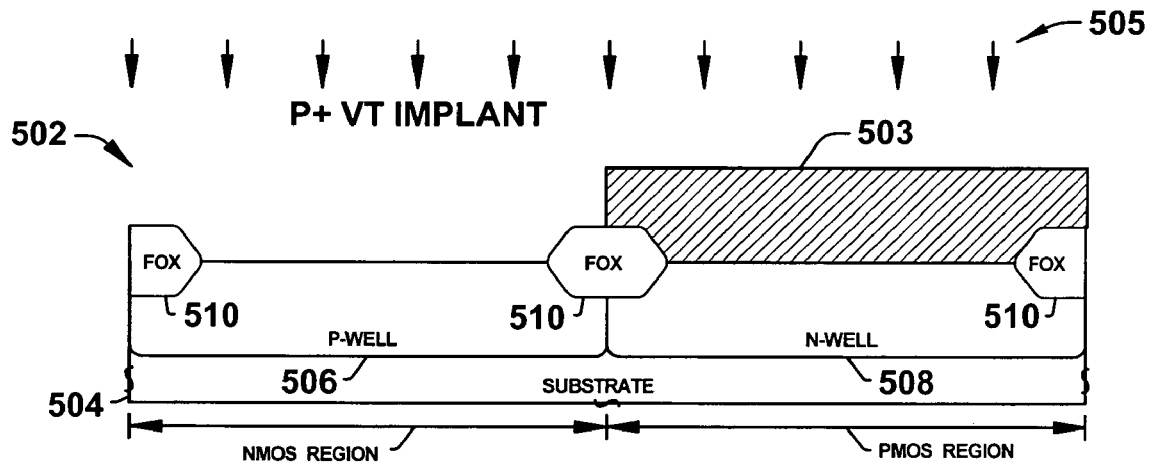
Figure 5C:
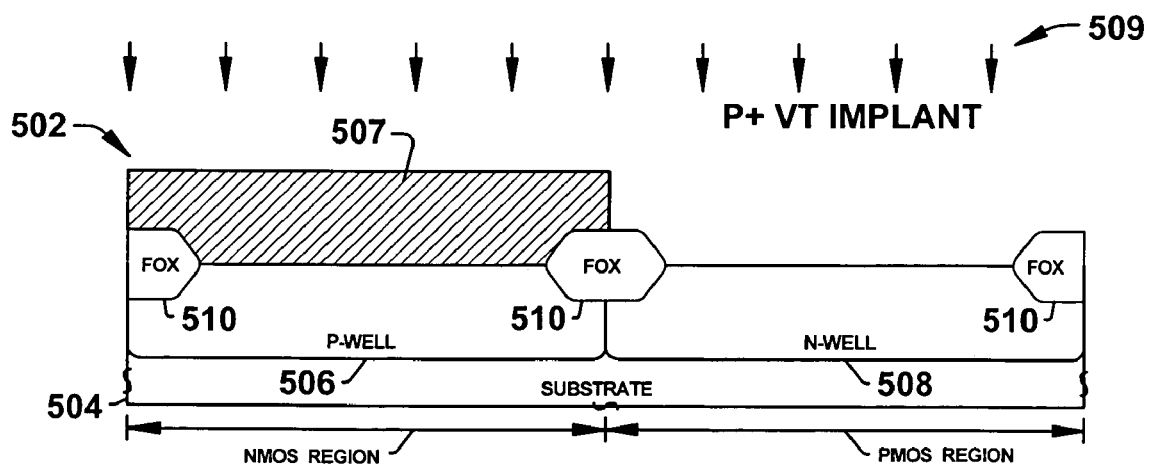
Figure 5D:
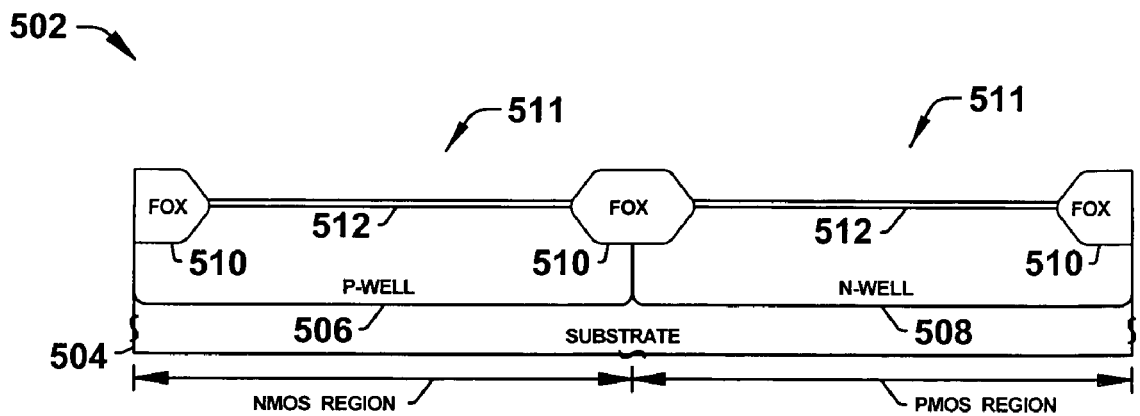
Figure 5E:
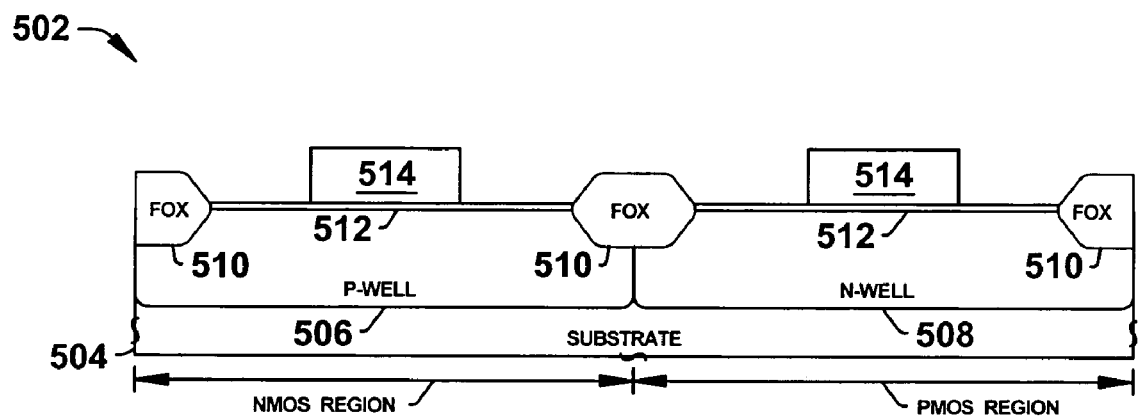
Figure 5F:
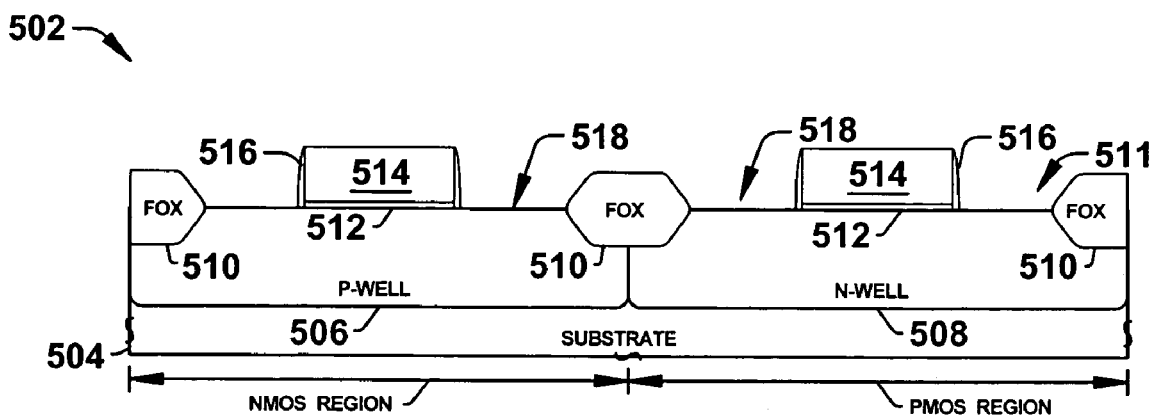
Figure 5G:
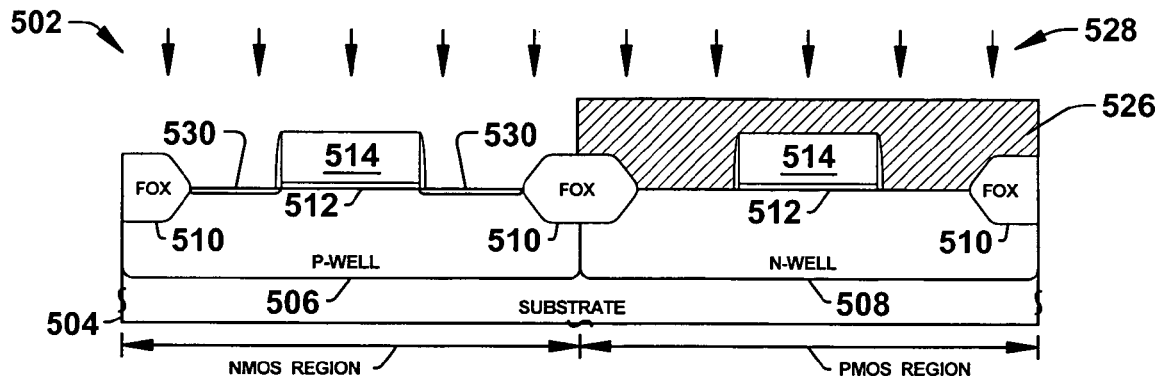
Figure 5H:
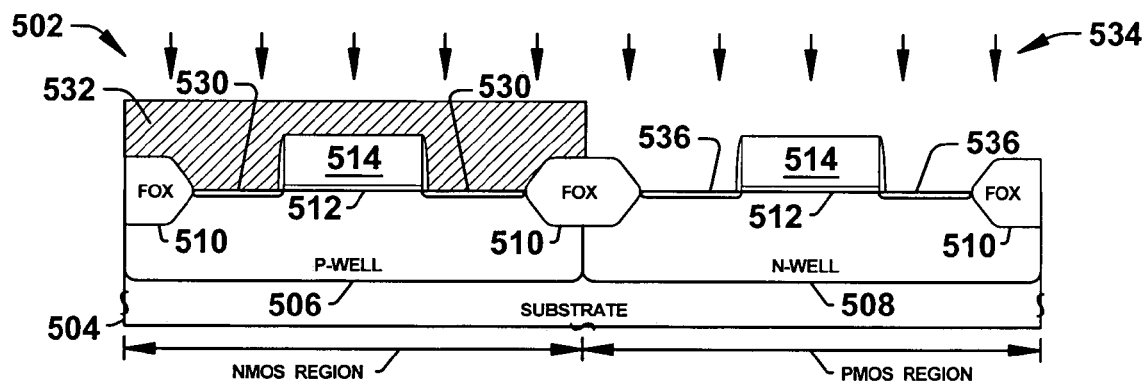
Figure 5I:
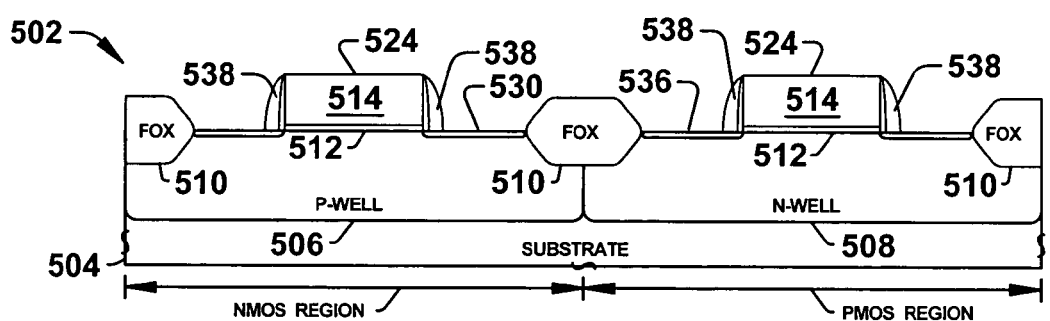
Figure 5J:
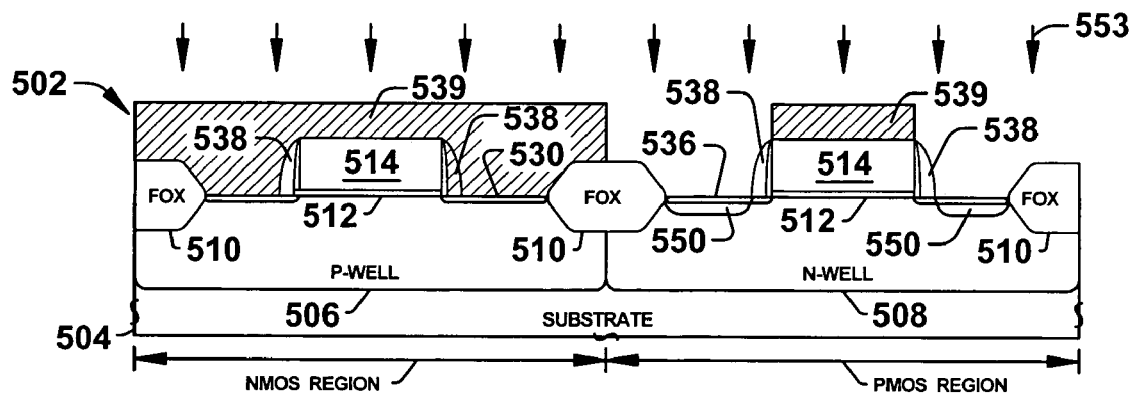
Figure 5K:
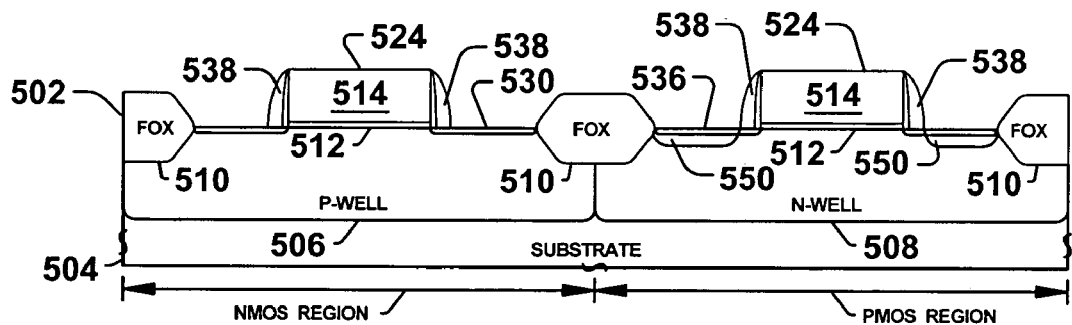
Figure 5L:
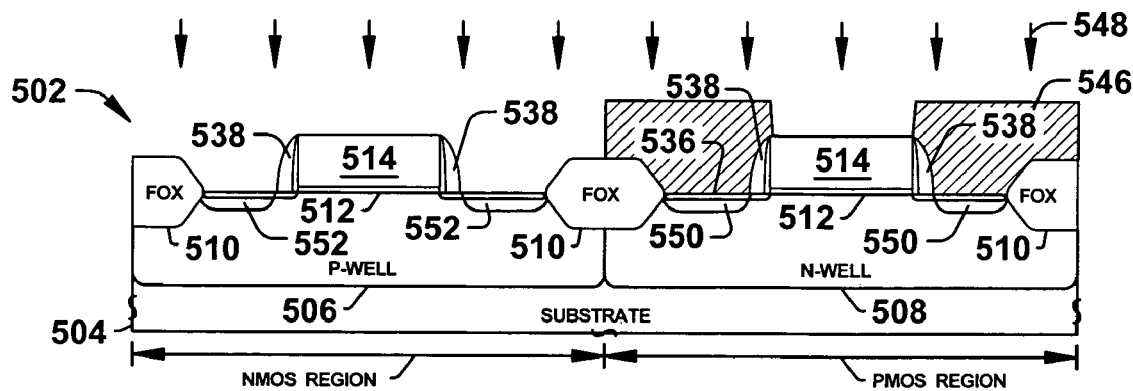
Figure 5M:
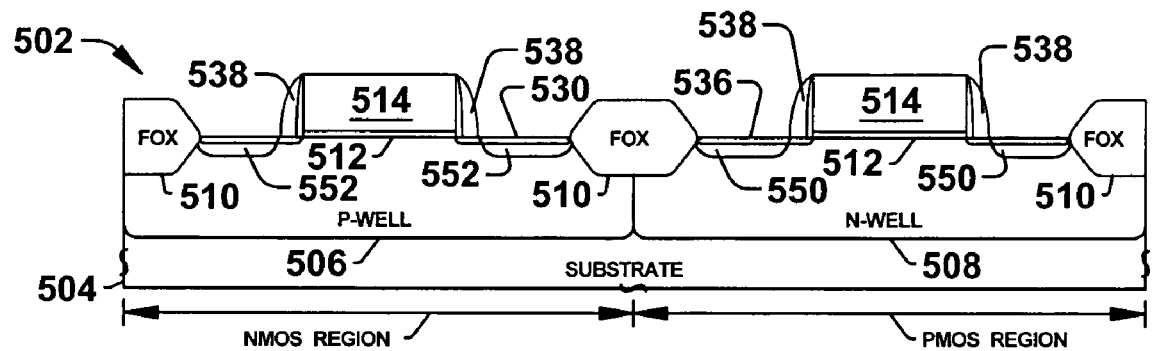
Figure 5N:
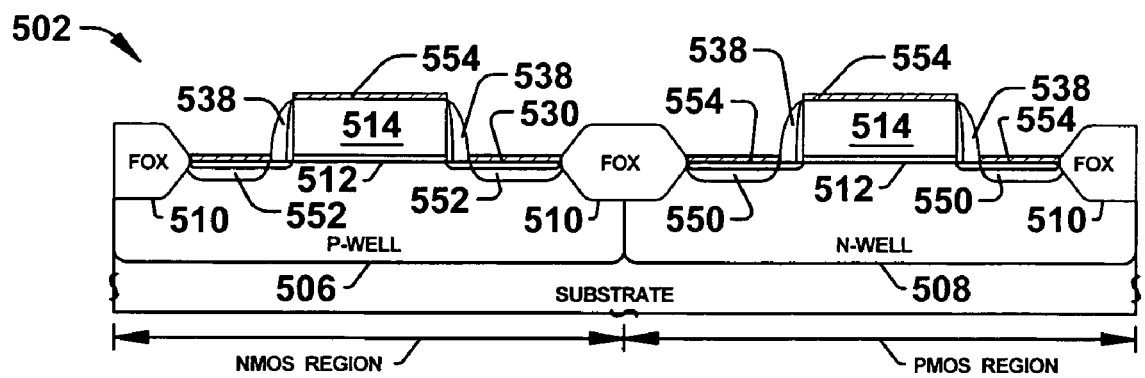

Turning now to FIGS. 5A-5N, a plurality of fragmentary cross section diagrams illustrating a transistor device being formed in accordance with the present invention by the method 400 of FIG. 4 is provided. In FIG. 5A, a transistor device 502 is provided, wherein a semiconductor body 504, such as a semiconductor substrate, has a number of wells formed therein, such as a p-well region 506 to define an NMOS transistor device region and an n-well region 508 to define a PMOS transistor device region, respectively. Further, isolation regions 510 such as STI regions are formed in the semiconductor body to define active area regions 511, as may be appreciated.

In FIG. 5B, the transistor device 502 is illustrated, wherein an NMOS threshold voltage implant is performed. One or more successive implants of a p-type dopant are performed to increase or adjust the threshold voltage, which is a sufficient voltage to induce conduction or strong inversion in channel regions of devices within the NMOS region.

FIG. 5C illustrates the transistor device 502, wherein a PMOS threshold voltage implant is performed. Similarly, one or more successive implants of a p-type dopant, instead of an n-type dopant, are performed to adjust the threshold voltage, which is a sufficient voltage to induce conduction or strong inversion in channel regions of devices within the PMOS region. Since the PMOS devices within the PMOS region comprise n-type well regions 508, the p-type implant(s) are considered counter doping. The p-type dopant is used instead of an n-type dopant because later formed polysilicon gates are n-type instead of p-type. It is appreciated that the PMOS threshold voltage implant can be performed at the same time as the NMOS threshold voltage implant.

A diffusion inhibitor, such as carbon, can be implanted with the p-type dopants (in the PMOS region) in order to mitigate diffusion of the implanted p-type dopant(s). It is noted that p-type dopants, such as boron, can diffuse rather rapidly. Therefore, use of the diffusion inhibitor mitigates diffusion of the p-type dopants so that the threshold voltage can be adjusted without substantially altering electrical/conduction properties of the channel and well regions 508 formed therein.

In FIG. 5D, the transistor device 502 is illustrated, wherein a high-k gate dielectric layer 512 has been formed over the active areas 511. The high-k dielectric layer 512 is formed by depositing a suitable dielectric material over the device. The layer 512 is formed to a thickness that results in a selected or desired equivalent oxide thickness.

Generally, the suitable dielectric material includes dielectric materials having a higher dielectric constant than silicon dioxide. Some examples of suitable dielectric material include binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

Referring to FIG. 5E, a polysilicon layer has been formed and patterned via an etching process to form polysilicon gates 514 overlying the gate dielectric 512. A suitable deposition process, such as chemical vapor deposition, is employed to deposit the polysilicon layer. Then, one or more etches are performed using a resist mask to remove portions of the polysilicon layer and the high-k dielectric layer 512 and form the polysilicon gates 514.

Turning now to FIG. 5F, offset spacers 516 are then formed on the lateral edges of the polysilicon gate structures. The offset spacers 516 are comprised of an insulative material, such as nitride or oxide, and are relatively thin. The offset spacers 516 operate to protect the gate electrodes 514 and to align and define subsequently formed regions.

The PMOS region-is then masked with a resist mask 526, as illustrated in FIG. 5G, comprised of a masking material such as photoresist, and an extension region implant 528 is performed to form n-type extension regions 530 in the NMOS region. The n-type extension region mask 526 is then removed and a p-type extension region mask 532 is deposited and patterned to cover the NMOS region, as illustrated in FIG. 5H. A p-type extension region implant process 534 is performed to form p-type extension regions 536 in the PMOS region, as illustrated in FIG. 5H. The mask 532 is then removed and a thermal process such as a rapid thermal anneal is typically performed to activate the implanted dopants, wherein a lateral diffusion of the extension regions 530, 536 under the offset spacers 516 can be achieved.

Sidewall spacers 538 are formed over the offset spacers 516 on the lateral edges of the gate structures as shown in FIG. 5I. To form the sidewall spacers 538, insulating sidewall material(s) are deposited in a generally conformal manner over the device and subsequently subjected to an anisotropic etch to remove the insulating material on top of the gate and over the active areas, leaving sidewall spacers 538 in both the NMOS and PMOS regions, as illustrated in FIG. 5I. Some examples of suitable insulative materials include oxide and nitride.

A PSD resist mask 539 is formed that exposes active regions of the PMOS region as depicted in FIG. 5J. The PSD resist mask 539 differs from typical, conventional PSD resist masks that expose the entire PMOS region by blocking subsequent implants to the PMOS polysilicon gate. Then, p-type dopant(s) are implanted 553 into the exposed areas to form PMOS source/drain regions 550. Then, the PSD resist mask 539 is removed as shown in FIG. 5K. A thermal process may be performed to activate the PMOS source/drain regions 550.

An NSD resist mask 546 is formed that exposes the NMOS region and polysilicon gates 514 within the PMOS region as shown in FIG. 5L. The NSD resist mask 546 also differs from typical, conventional NSD resist masks that expose only the NMOS region, by also exposing the polysilicon gate in the PMOS region. Subsequently, n-type dopant(s) are implanted into the exposed areas to form NMOS source drain regions 552 and n-type doped polysilicon gates 514 within both the PMOS region and the NMOS region.

The NSD resist mask 546 is then removed and a thermal process may be performed to activate the implanted n-type dopant(s), which is illustrated in FIG. 5M.

FIG. 5N illustrates formation of silicide regions 554 that serve to lower contact resistance to the polysilicon gates 514, NMOS source/drain regions 552, and PMOS source/drain regions 550. Typically, silicide regions are formed by depositing a refractory metal (e.g., aluminum, cobalt, alloys thereof, and the like) is over the device and inducing (e.g., by annealing) the deposited refractory metal to react with underlying silicon forming silicide regions that reduce contact resistance between active regions and electrodes with contacts, interconnects, and the like. Un-reacted refractory metal is then removed. Subsequently, back end processing, including metallization to interconnect the various transistors, may be performed, as may be desired.

It is appreciated that the views and the exemplary device 502 described in FIGS. 5A to 5M are exemplary in nature and that the present invention is not limited to the composition, dimensions, and structure depicted therein. It is noted that the present invention includes other transistor devices, but with varied materials and compositions.

While, for purposes of simplicity of explanation, the methodologies of FIGS. 2 and 3 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a PMOS transistor device comprising:
   forming a n-type well region within a semiconductor body;
   performing a threshold voltage adjustment implant by implanting a p-type dopant into the n-type well region to form a shallow counter doped region;
   forming a high-k dielectric layer over the device;
   forming a polysilicon layer on the high-k dielectric layer;
   patterning the high-k dielectric layer and the polysilicon layer to form a polysilicon gate structure;
   implanting a p-type dopant into active areas of the n-type well region to form source/drain regions; and
   implanting an n-type dopant into the polysilicon layer to form an n-type doped polysilicon gate structure after patterning the polysilicon layer.

2. The method of claim 1 wherein performing a threshold voltage adjustment implant comprises implanting the p-type dopant with a dose and energy that compensates for a known threshold shift, wherein the known threshold shift is a function of the high-k dielectric layer and the implanted n-type dopant in the polysilicon layer.

3. The method of claim 1, wherein performing a threshold voltage adjustment implant comprises implanting the p-type dopant with a dose and energy that compensate for a known threshold shift, wherein the known threshold shift is equal to about 1.1 volts.

4. The method of claim 1, wherein forming the high-k dielectric layer over the device comprises depositing HfSiON over the device.

5. The method of claim 1, further comprising forming a resist mask over the device that covers the polysilicon gate structure and exposes the active regions prior to implanting the p-type dopant into the active areas.

6. A method of fabricating a PMOS transistor device comprising:
   forming a n-type well region within a semiconductor body;
   performing a threshold voltage adjustment implant by implanting a p-type dopant into the n-type well region to form a shallow counter doped region;
   forming a high-k dielectric layer over the device;
   forming a polysilicon layer on the high-k dielectric layer;
   patterning the high-k dielectric layer and the polysilicon layer to form a polysilicon gate structure;
   implanting a p-type dopant into active areas of the n-type well region to form source/drain regions;
   implanting an n-type dopant into the polysilicon layer to form an n-type doped polysilicon gate structure; and
   forming a resist mask over the device that covers the active regions and exposes the polysilicon gate structure prior to implanting the n-type dopant into the polysilicon gate.

7. The method of claim 1, wherein performing a threshold voltage adjustment implant also comprises implanting a dopant diffuser inhibitor.

8. The method of claim 1, wherein performing a threshold voltage adjustment implant also comprises implanting carbon as a dopant diffuser inhibitor.

9. A method of fabricating a semiconductor device comprising:
   forming isolation regions;
   forming n-type well regions in a PMOS region of a semiconductor body;
   forming p-type well regions in an NMOS region of the semiconductor body;
   performing a threshold voltage adjustment implant within the NMOS region by implanting a p-type dopant;
   performing a threshold voltage adjustment implant within the PMOS region by implanting a p-type dopant;
   forming a high-k dielectric layer over the device;
   forming a polysilicon gate layer on the high-k dielectric layer;
   patterning the high-k dielectric layer and the poly gate layer to form polysilicon gate structures within the PMOS region and the NMOS region;
   forming a PSD resist mask that exposes active areas of the PMOS region and covers the NMOS region and the gate structures of the PMOS region;
   forming source/drain regions in active areas of the PMOS region by implanting a p-type dopant;
   removing the PSD resist mask;
   forming an NSD resist mask that exposes the NMOS region and the gate structures of the PMOS region and covers the active areas of the PMOS region;
   forming source/drain regions in active areas of the NMOS region and n-type doped polysilicon gate structures of the NMOS region and the PMOS region by implanting an n-type dopant; and
   removing the NSD resist mask.

10. The method of claim 9, wherein performing the threshold voltage adjustment implant within the PMOS compensates for a known threshold voltage shift.

11. The method of claim 9, wherein forming the polysilicon gate layer comprises depositing undoped polysilicon over the device.

12. The method of claim 9, wherein forming the polysilicon gate layer comprises depositing doped polysilicon over the device.

13. The method of claim 9, wherein performing the threshold voltage adjustment implant within the PMOS region and performing the threshold voltage adjustment implant within the NMOS region are performed simultaneously.

14. The method of claim 9, wherein performing the threshold voltage adjustment implant within the PMOS region further comprises implanting a diffusion inhibiter.

15. The method of claim 14, wherein implanting the diffusion inhibiter comprises implanting carbon.

16. The method of claim 9, wherein performing the threshold voltage adjustment implant within the PMOS region further comprising implanting an n-type dopant and wherein implanting the p-type dopant is performed with a relatively low energy.

* * * * *